(12) United States Patent
Horimoto et al.

(10) Patent No.: US 8,148,301 B2
(45) Date of Patent: *Apr. 3, 2012

(54) METHOD FOR POLISHING TAPE-SHAPED SUBSTRATE FOR OXIDE SUPERCONDUCTOR, OXIDE SUPERCONDUCTOR, AND BASE MATERIAL FOR OXIDE SUPERCONDUCTOR

(75) Inventors: Sanaki Horimoto, Akishima (JP); Takuya Nagamine, Akishima (JP); Takehiro Watanabe, Akishima (JP); Fumi Murokawa, Akishima (JP); Yuji Horie, Akishima (JP); Noriyuki Kumasaka, Akishima (JP); Masahiro Hosoi, Akishima (JP)

(73) Assignee: NIHON Micro Coating Co., Ltd., Tokyo (JP)

( * ) Notice: Subject to any disclaimer, the term of this patent is extended or adjusted under 35 U.S.C. 154(b) by 159 days.

This patent is subject to a terminal disclaimer.

(21) Appl. No.: 12/438,601

(22) PCT Filed: Aug. 24, 2007

(86) PCT No.: PCT/JP2007/066424
§ 371 (c)(1),
(2), (4) Date: Feb. 19, 2010

(87) PCT Pub. No.: WO2008/023782
PCT Pub. Date: Feb. 28, 2008

(65) Prior Publication Data
US 2010/0160170 A1 Jun. 24, 2010

(30) Foreign Application Priority Data

Aug. 25, 2006 (JP) ................. 2006-229710

(51) Int. Cl.
*H01L 39/24* (2006.01)
(52) U.S. Cl. ........ 505/434; 505/430; 505/433; 505/813; 505/230; 505/232; 505/236; 505/239
(58) Field of Classification Search ................. 505/430, 505/433, 434, 813, 230, 232, 236, 239
See application file for complete search history.

(56) References Cited

U.S. PATENT DOCUMENTS

| 6,114,287 A * | 9/2000 | Lee et al. ................ 505/473 |
| 6,908,362 B2 * | 6/2005 | Selvamanickam et al. ..... 451/28 |
| 7,510,641 B2 * | 3/2009 | Kreiskott et al. ............ 205/640 |
| 7,776,793 B2 * | 8/2010 | Watanabe et al. ............ 505/430 |
| 7,811,972 B2 * | 10/2010 | Horie et al. .................. 505/430 |
| 2009/0163122 A1 * | 6/2009 | Watanabe et al. ............ 451/57 |
| 2010/0016169 A1 * | 1/2010 | Horimoto et al. ............ 505/230 |
| 2010/0267568 A1 * | 10/2010 | Matsumoto et al. .......... 505/236 |

FOREIGN PATENT DOCUMENTS

| JP | 09052793 A * | 2/1997 |
| JP | 2003095666 A * | 4/2003 |
| JP | 2005056591 A * | 3/2005 |
| JP | 2005056754 A * | 3/2005 |

* cited by examiner

*Primary Examiner* — Douglas Mc Ginty
(74) *Attorney, Agent, or Firm* — Weaver Austin Villeneuve & Sampson LLP (57) ABSTRACT

An oxide superconductor member is composed of a tape-shaped substrate, an intermediate layer formed on this substrate and an oxide superconductor thin film layer formed on this intermediate layer. A surface of the tape-shaped substrate is polished by continuously running the tape-shaped substrate. The polishing step includes initial polishing process and finishing process which are carried out such that the average surface roughness Ra of the substrate becomes 2 nanometers or less and the in-plane directionality of the intermediate layer becomes 5° or less after the polishing step.

14 Claims, 10 Drawing Sheets

METHOD FOR POLISHING TAPE-SHAPED SUBSTRATE FOR OXIDE SUPERCONDUCTOR, OXIDE SUPERCONDUCTOR, AND BASE MATERIAL FOR OXIDE SUPERCONDUCTOR

This application is a continuation of International Application No. PCT/JP2007/066424, filed Aug. 24, 2007 which claims priority on Japanese Patent Application 2006-229710 filed Aug. 25, 2006.

BACKGROUND OF THE INVENTION

This invention relates to a method for polishing a target surface for forming an oxide superconductor thin film on the surface of a tape-shaped substrate, as well as to a substrate for an oxide superconductor. In particular, this invention relates to a substrate for an oxide superconductor obtained by polishing the target surface of a tape-shaped metallic substrate with a level of smoothness on the order of nanometers and forming an intermediate layer thereon.

Oxide superconductors are superior superconductors having critical temperatures beyond the liquid nitrogen temperatures.

Typical examples of tape-shaped superconductor wire material include tape-shaped wire materials obtained by forming a polycrystalline oriented film of yttria-stabilized zirconia (YSZ) crystalline direction-controlled for example by the IBAD (Ion Beam Assisted Deposition) method on the surface of a Hastelloy® alloy tape comprising a Ni alloy and further forming an oxide superconductor film of YBCO type (such as $YBa_2Cu_3O_{7-y}$) as disclosed, for example, in Japanese Patent Publication Tokkai 9-120719.

There are currently many kinds of problems to be solved in order to make the oxide superconductor materials of this kind practically usable.

One of these problems is that oxide superconductors have low critical current densities. A main cause of this is that there exists electrical anisotropy in the crystal structures of oxide superconductors. It is known in particular that oxide superconductors can easily allow an electric current to flow in the directions of the a-axis and the b-axis of their crystalline axes but a current cannot easily be made to flow in the direction of the c-axis. In order to form an oxide superconductor on a substrate and to use it as a superconductor, therefore, it is necessary to form on the substrate a superconductor with good crystalline directionality, to orient the a-axis or the b-axis of the crystal of the oxide superconductor in the direction intended for the flow of the electric current, and to orient the c-axis of the oxide superconductor in another direction.

As a method for achieving the above, Japanese Patent Publications Tokkai 6-145977 and 2003-36742, which are herein incorporated by reference, disclose a method of providing the surface of an elongated tape-shaped metallic substrate with an intermediate layer with controlled crystalline directionality and to form a film of oxide superconductor thereabove.

If the directionality of the intermediate layer is improved, the directionality of the superconductor film formed thereabove is also improved. For obtaining a superconductor film with high critical current (Ic) and critical current density (Jc), it is particularly essential to obtain a high level of biaxial directionality.

Since the directionality of the intermediate layer to be formed for this purpose depends upon the crystalline characteristic of the surface of the underlying tape-shaped substrate, the crystalline direction and the in-plane directionality of the tape-shaped substrate become important for obtaining an intermediate layer with good directionality.

For crystallizing the intermediate layer film such that good directionality is obtained, it is necessary to finish the surface of the tape-shaped substrate so as to have smoothness and flatness on the level of several nanometers.

U.S. Pat. No. 6,908,362 disclosed another method according to which the surface of a nickel or nickel alloy tape accurately and an oxide superconductor thin film thereafter.

Another problem that is preventing superconductivity from becoming practically usable relates to the behavior of magnetic flux quanta. The Lorentz force generated by the flow through a superconductor tends to move magnetic flux quanta but the motion of magnetic flux quanta generates heat and the superconducting condition becomes destroyed. Thus, it becomes possible to increase the critical current (Ic) that can be passed through a superconductor if magnetic flux quanta can be pinned so as not to move. Japanese Patent Publications Tokkai 6-145977 and 2003-36742 are prior art documents that teach the importance of polishing the surface of the base material so as to be smooth and flat.

It is technologically difficult, however, to polish the surface of a tape-shaped substrate to the level of several nanometers by a mechanical polishing process, and there has not been any example of success.

SUMMARY OF THE INVENTION

As described above, it is necessary for obtaining a high critical current to form a tape-shaped metallic substrate with a surface that is sufficiently flat and where the crystalline directionality is easily controllable. Accordingly, the surface of the tape-shaped metallic substrate for forming the thin film thereon must be finished to a level of smoothness on the order of nanometers and also be formed such that its crystal directionality becomes good.

The present inventors have succeeded in overcoming the difficulties described above as a result of their diligent studies. The present invention has been accomplished in view of the problems described above and its object is to provide a mechanical surface polishing method for finishing the surface of a tape-shaped metallic substrate to a level of smoothness on the order of several nanometers and improving the crystal directionality of the intermediate layer formed thereon such that the critical current of the superconductor film can be improved.

In one aspect, the present invention relates to an oxide superconductor member comprising a tape-shaped substrate, an intermediate layer that is formed on this tape-shaped substrate and an oxide superconductor thin film layer that is formed on this intermediate layer, and more particularly to a method of polishing a target surface of this tape-shaped substrate, this method being characterized as comprising a polishing step of polishing its target surface while running the tape-shaped substrate, and including an initial polishing process and a finishing process, wherein the average surface roughness Ra of the target surface becomes 2 nanometer or less and the in-plane directionality $\Delta\phi$ of the intermediate layer becomes 5° or less after the polishing step.

According to an embodiment of the invention, the initial polishing process comprises a first polishing process of carrying out random polishing on the target surface in one stage, and the finishing process comprises a second polishing process of carrying out random polishing on the target surface in one stage.

According to another embodiment of the invention, the finishing process comprises a second polishing process of carrying out polishing surface in a running direction of the tape-shaped substrate in one stage on the target surface. In this case, polishing marks are formed in this running direction on the target surface by the second polishing process.

Explained in detail, the tape-shaped substrate may be fabricated by rolling a material selected from the group consisting of nickel, nickel alloys and stainless steel.

In the above, the polishing step may be carried out by employing a pad or a tape of a foamed material comprising synthetic resin and fibers and while slurry is being supplied.

Explained in detail, the slurry comprises abrading particles, water and a mixture of an additive with water, wherein said abrading particles are of at least one material selected from the group consisting of monocrystalline diamond, polycrystalline diamond, fumed silica, colloidal silica, alumina, cBN and SiC.

In the above, the average diameter of the abrading particles is preferably 0.1 μm-3 μm for the first polishing process and 0.02 μm-0.5 μm for said second polishing process.

Explained in detail, the abrading particles used in the second polishing process are diamond particles used for polishing longitudinally along the substrate.

According to an embodiment of the invention, the intermediate layer is 1 μm or less in thickness.

In another aspect, the present invention relates to an oxide superconductor member comprising a tape-shaped substrate having a target surface, an intermediate layer formed on the target surface of the tape-shaped substrate, and an oxide superconductor thin film layer formed on the intermediate layer, wherein the target surface of the tape-shaped substrate has been polished by one of the methods of this invention described above such that the average surface roughness Ra of said target surface becomes 2 nanometer or less and the in-plane directionality $\Delta\phi$ of said intermediate layer becomes 5° or less after said polishing step.

In still another aspect, the present invention relates to a base material for an oxide superconductor member comprising a tape-shaped substrate having a target surface, and an intermediate layer formed on the target surface of the tape-shaped substrate, wherein the target surface of the tape-shaped substrate has been polished by one of the methods of this invention described above such that the average surface roughness Ra of said target surface becomes 2 nanometer or less and the in-plane directionality $\Delta\phi$ of said intermediate layer becomes 5° or less after said polishing step.

BRIEF DESCRIPTION OF THE DRAWINGS

FIG. 2 includes FIGS. 2A, 2B, 2C, 2D and 2E, FIGS. 2A, 2B and 2C being respectively a front view, a plan view and a side view of an example of polishing head, FIG. 2D showing a polishing head, and FIG. 2E showing another example of polishing head.

FIG. 3 includes FIGS. 3A and 3B which are respectively a front view and a side view of a compressing mechanism in a polishing system for using a polishing method of this invention.

FIG. 4 includes FIGS. 4A and 4B which are respectively a front view and a side view of a polishing head for polishing in the running direction in a polishing system for using a polishing method of this invention.

FIG. 5 includes FIGS. 5A and 5B which are respectively a front view and a side view of another example of polishing head for polishing in the running direction in a polishing system for using a polishing method of this invention.

DETAILED DESCRIPTION OF THE INVENTION

The invention is described next with reference to the drawings but the examples described herein are not intended to limit the scope of the invention.

Regarding an oxide superconductor of this invention comprising a tape-shaped substrate, an intermediate layer formed on this tape-shaped substrate and an oxide superconductor thin film layer formed on this intermediate layer, a method of polishing a target surface of this tape-shaped substrate is characterized as comprising the steps of carrying out initial polishing and final polishing (or finishing) while continuously running the tape-shaped substrate, such that the average surface roughness Ra of the target surface finally becomes 2 nanometers or less and the in-plane directionality $\Delta\phi$ of the intermediate layer becomes 5° or less. The initial polishing comprises a first polishing process for carrying out random polishing of the target surface of the tape-shaped substrate in at least one stage, and the finishing comprises a second polishing process for carrying out random polishing of the target surface of the tape-shaped substrate in at least one stage.

As the tape-shaped metallic substrate in the above, pure Ni, Ni-based alloys such as Ni—Cr and Ni—W, pure Cu, Cu-based alloys such as Cu—Ni and Fe-based alloys such as Fe—Si and stainless steel which are superior in resistance against high temperatures and corrosion may be used. More specifically, Hastelloy® (of Haynes International, Inc.) and Inconel® (of Special Metals Corporation) and Ni alloys such as Ni-5% W, which are superior in resistance against corrosion and heat are usable. Such materials are fabricated by the technology of rolling into a thickness of 0.05 mm-0.5 mm, width of 2 mm-100 mm and length of several hundred meters. Metallic materials for rolling are polycrystalline and have crystalline structure aligned in the direction of the rolling.

This tape-shaped substrate has linear scratches in the direction of rolling or crystalline defects. According to this invention, a random rotary polishing process is firstly carried out to remove these surface scratches formed by the rolling and the crystalline defects, and the target surface is thereafter finished by another random polishing process to become flat. An intermediate layer film and a superconductor film are sequentially formed on the target surface such that an oxide superconductor with a high critical current can be formed.

The principal purpose of the first polishing process is to remove the marks and defects generated on the surface of the tape-shaped metallic substrate by the rolling process. The average surface roughness (Ra) of the tape-shaped substrate after the first polishing process is preferably 10 nm or less and more preferably 5 nm or less.

The second polishing process is a process for the final finishing and its purpose is to form a surface on the tape-shaped substrate with superior crystal directionality such that an intermediate layer film with superior in-plane directionality can be formed thereon. The average surface roughness (Ra) of the tape-shaped substrate after the second polishing process is preferably 5 nm or less, more preferably 2 nm or less, and even more preferably 1 nm or less.

Figure 1:
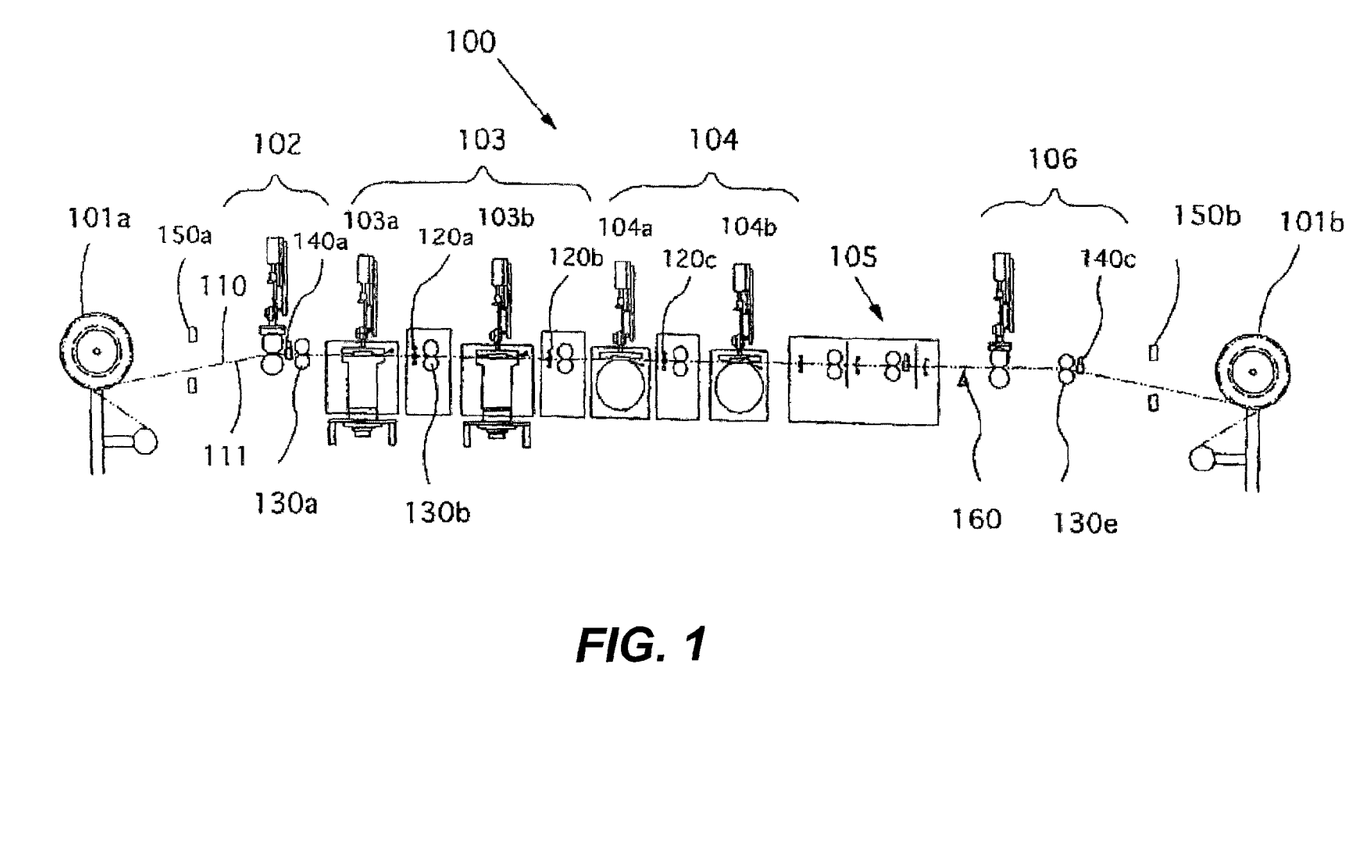
FIG. 1 shows schematically an example of polishing system for carrying out a method of this invention for polishing a tape-shaped substrate.

FIG. 1 shows schematically an example of polishing system that may be employed for using a method of this invention for polishing a tape-shaped substrate for an oxide superconductor. The polishing system 100 comprises a feeder part 101a, a back tension part 102, a first polishing processing part 103, a second polishing processing part 104, a washing part 105, an inspection part 160, a work piece driver part 106 and a wind-up part 101b.

A tape-shaped metallic substrate 110 wound around a feeder reel of the feeder part 101a passes through the back tension part 102 and enters the first polishing processing part 103. The tape-shaped substrate 110 is firstly subjected in the first polishing processing part 103 to a first polishing process to be explained in detail below. Next, the tape-shaped substrate 110 is advanced to the second polishing processing part 104 where it is subjected to a second polishing process to be explained in detail below. Thereafter, the tape-shaped substrate 110 is brought to the washing part 105 where a final cleaning process is carried out. The surface roughness Ra and the polishing marks on the tape-shaped substrate 110 thus processed are observed at the inspection part 160 to be explained in detail below. Thereafter, the tape-shaped substrate 110 passes through the work piece driver part 106 and is finally wound up around a wind-up reel of the wind-up part 101b.

It is preferable to wash the tape-shaped substrate 110 after each polishing process is carried out (as shown at 120a, 120b and 120c). In this manner, remaining abrading particles, polishing debris and residual slurry can be removed.

As will be explained below, the running motion of the tape-shaped substrate is controlled by the back tension part 102 and the work piece driver part 106 while it is maintained in a condition under a specified tension. There are also a plurality of width-regulating guides 140a, 140b and 140c provided at appropriate intervals as explained in detail below for preventing positional displacement of the tape-shaped substrate. Slackness-detecting sensors 150a and 150b are further provided on the downstream side of the feeder reel and the upstream side of the wind-up reel for detecting the slackness of the tape-shaped substrate and controlling the rotary speed of the wind-up reel.

The tape-shaped metallic substrate 110 provided with the specified tension is subjected to the first polishing process at the first polishing processing part 103. Although FIG. 1 shows the polishing system as polishing only the lower surface 111 of the tape-shaped metallic substrate 110, this is not intended to limit the scope of the invention. The polishing system may be adapted to polish the upper surface of the tape-shaped metallic substrate 110.

Figures 2A, 2B, 2C:
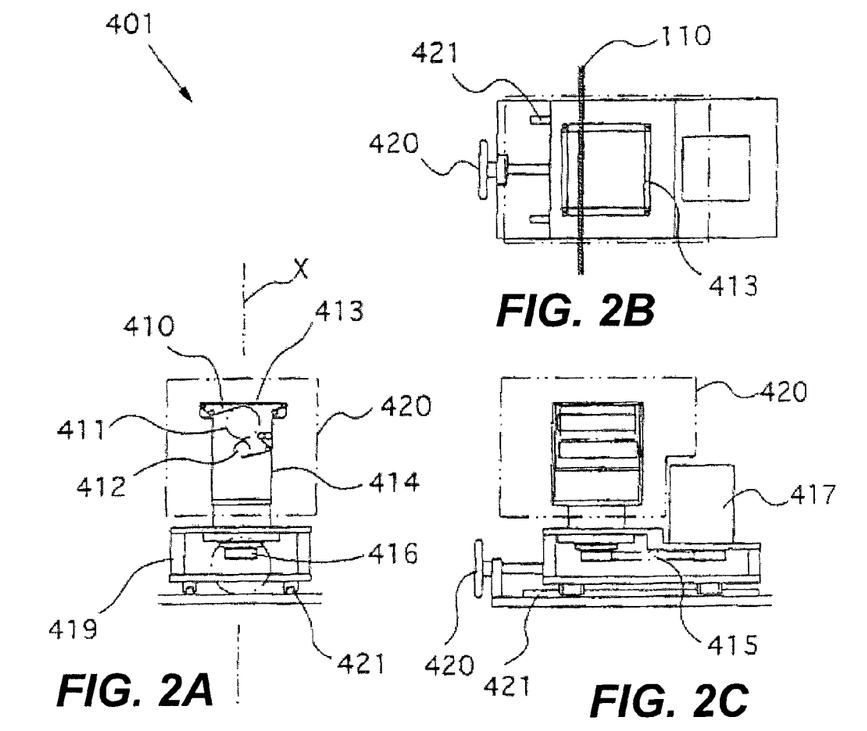

The first polishing processing part 103 comprises at least one polishing station (two polishing stations 103a and 103b being shown in FIG. 1) each having a polishing head 401 (shown in FIG. 2) and a compressing mechanism 440 (shown in FIG. 3) and one or more washing devices 120a and 120b each provided on the downstream side of the corresponding polishing station. FIGS. 2A, 2B and 2C are respectively a front view, a plan view and a side view of an example of polishing head 401, comprising a feeding mechanism for feeding a polishing tape 410 onto a polishing table 413 and a rotating mechanism for rotating the polishing table 413 around an axial line perpendicular to its polishing surface.

The feeding mechanism comprises a feeder reel 411 with the polishing tape 410 wound around it, at least one supporting roller, a wind-up reel 412 for winding up the polishing tape after the polishing process and a driver motor (not shown) dynamically connected to both the feeder reel 411 and the wind-up reel 412. They are all enclosed inside a housing 414. Woven cloth, non-woven cloth and flocked cloth made of foamed urethane, suede, polyester or nylon may be used as the polishing tape 410. Explained parenthetically, the housing 414 is wrapped inside a cover 420 for preventing slurry from scattering to the exterior during the polishing process. As the driver motor is operated, the polishing tape 410 is fed out of the feeder reel 411, passes on the polishing table 413 through the supporting reels and is finally wound up by the wind-up reel 412. An unused portion of the polishing tape 410 is always being supplied onto the polishing table 413 for polishing the target surface of the tape-shaped metallic substrate 110. It is preferable to supply the aforementioned slurry during the polishing process. The slurry is preferably one comprising abrading particles, water and a mixture of an additive (such as a lubricant and a dispersant for the abrading particles) with water. Examples of the abrading particles include diamond (monocrystalline and polycrystalline), silica (colloidal silica and fumed silica), alumina, SiC and cBN. The average diameter of the abrading particles in the slurry is 0.1 μm-3 μm for the first polishing process and 0.02 μm-0.5 μm for the second polishing process. A plurality of polishing devices may be provided for each polishing process, each polishing device using abrading particles with a different average diameter. Alternatively, polishing may be carried out continuously by using abrading particles with the same average diameter according to the requirement on the target surface and for reducing the polishing time.

The rotating mechanism, on the other hand, comprises a spindle 416, which is at a lower part of the housing 414 and is connected coaxially to the rotary axis X of the polishing table 413, a motor 417 and a belt 415 for communicating the rotary power of the motor 417 to the spindle 416. There is also provided a supporting table 419 for supporting the motor 417 and the housing 414. The spindle 416 is inside the supporting table 419 and is rotatably attached thereto. Explained additionally, the supporting table 419 is carried on a pair of rails 421, and a handle 420 is provided to the supporting table 419 for moving the polishing station on the rails. As the motor 417 is operated, its rotary power is communicated through the belt 415 to the spindle 416, and the housing 414 rotates around the axial line X. It is possible to provide a plurality of polishing stations. In such a case, their housings may be rotated in opposite directions (such that the polishing tapes rotate in opposite directions) such that the polishing efficiency can be improved.

Figure 2D:
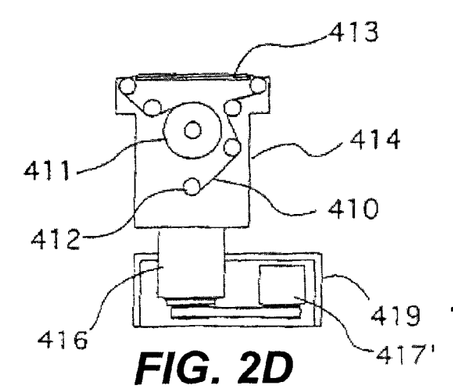

FIG. 2D shows a variation whereby the motor 417' is also contained inside the supporting table 419.

Figure 2E:
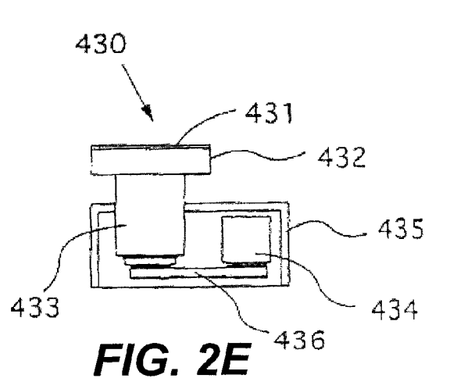

FIG. 2E shows another example of polishing head, using a polishing pad 431 instead of a polishing tape. This polishing head 430 comprises a platen 432 to which is pasted the polishing pad 431 for polishing the tape-shaped substrate 110, a spindle 433 for supporting the platen 432, a belt 436 and a motor 434. The spindle 433 is rotatably attached to the supporting table 435, and the motor 434 is contained inside this supporting table 435. As the motor 434 is operated, its rotary power is communicated through the belt 436 to the spindle 433, and the polishing pad 431 rotates and polishes the tape-shaped substrate 110. At the time of the polishing process, it is preferable to supply the aforementioned slurry approximately to the center of the polishing pad 431.

Figure 3A:
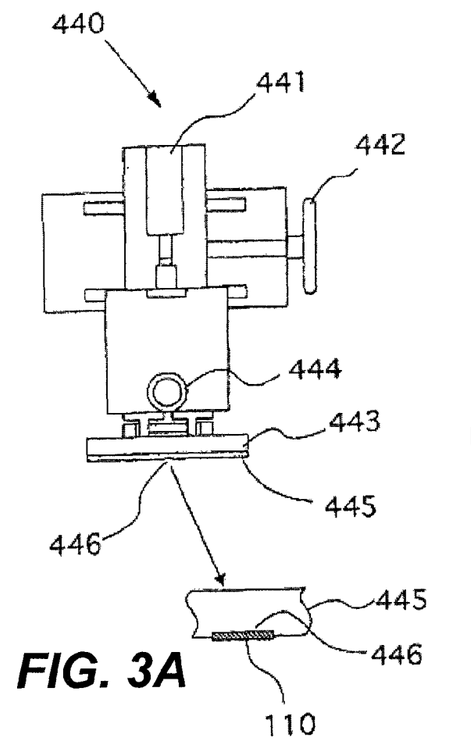
Figure 3B:
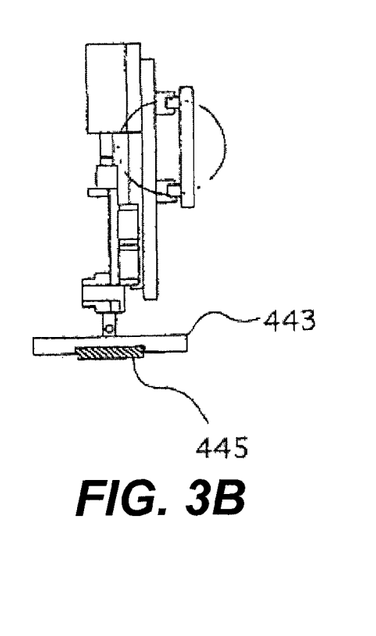

The compressing mechanism 440 is explained next. FIGS. 3A and 3B are respectively a front view and a side view of a compressing mechanism 440 used in a polishing system of this invention. The compressing mechanism 440 comprises an air cylinder 441, a compressing plate 443 and a holder plate 445 provided on the central line of the compressing plate 443 along the running direction of the tape-shaped substrate. The lower surface of the holder plate 445 is provided with a guide groove 446 corresponding to the width of the tape-shaped substrate 110 for preventing the generation of positional displacement of the tape-shaped substrate 110 during the polishing process. The holder plate 445 is appropriately exchangeable with another plate, depending on the size (width and thickness) of the tape-shaped metallic substrate 110. Explained additionally, there is a position-adjusting handle 442 connected to the side surface of the compression mechanism 440, serving to make adjustments such that the center in the direction of the width of the tape-shaped metallic substrate 110 will coincide with the center of the compression mechanism 440. In this manner, the pressure from the air cylinder 441 can be transmitted to the tape-shaped substrate 110 through the compressing plate 443 and the holder plate 445. There is also provided an adjustment screw 444 at an upper portion of the compressing plate 443. Prior to the polishing process, the parallel relationship between the compressing plate 443 and the polishing table 413 is adjusted by means of this adjustment screw 444. The descriptions given above are not intended to limit the compressing mechanism. A compressing mechanism with a different specification may be employed for the purpose of this invention.

Figure 4A:
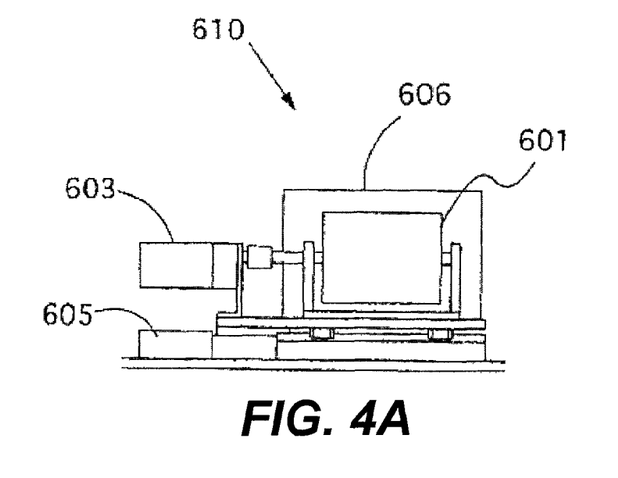
Figure 4B:
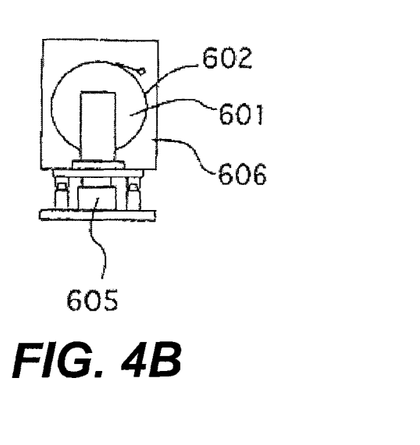

FIGS. 4A and 4B are respectively a front view and a side view of a preferable example of polishing head 610 used in the second polishing process for the tape-shaped substrate of this invention. The polishing head 610 comprises a cylindrical drum 601 having a resin sheet 602 wound around a cylindrical drum base made of stainless steel, for example, a driving motor 603 for rotating the cylindrical drum 601 and a driving mechanism (not shown) such as having a driving wheel. Foamed urethane, a woven cloth or a non-woven cloth may be used as the resin sheet 602. The cylindrical drum 601 is contained inside a housing 606. A motor 605 for causing the cylindrical drum 601 to oscillate in a direction perpendicular to the running direction of the tape-shaped substrate 110 may be additionally included. This oscillatory motion serves to prevent the tape-shaped metallic substrate 110 from being polishing at a same place on the cylindrical drum 601. At the time of the polishing, it is preferable to supply aforementioned slurry onto the resin sheet 602.

Figure 5A:
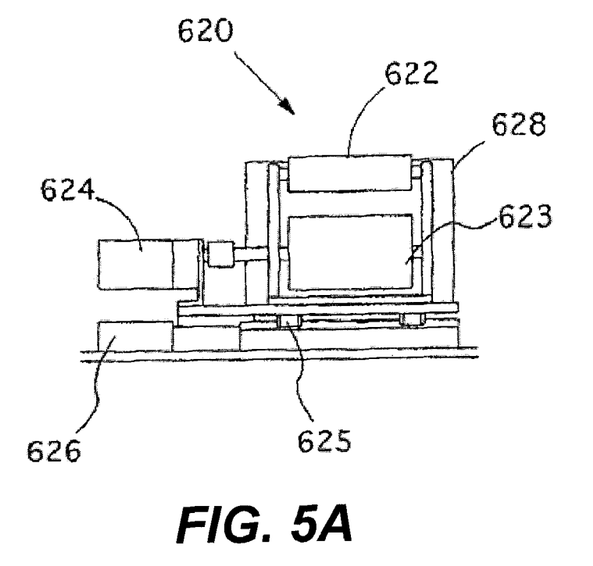
Figure 5B:
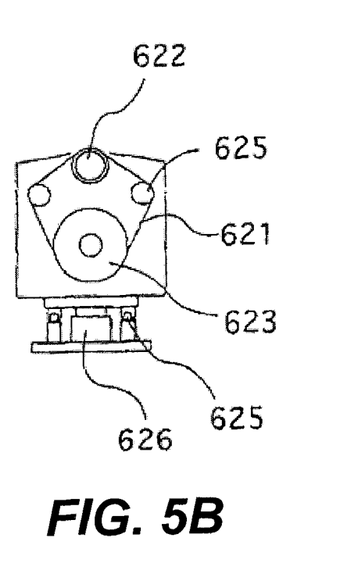

FIGS. 5A and 5B are respectively a front view and a side view of another preferable example of polishing head 620 used in the second polishing process for the tape-shaped substrate of this invention. This polishing head 620 comprises a contact roller 622 for pressing a polishing belt 621 onto the tape-shaped substrate 110, a polishing belt driving means 623, support rollers 625 and a driver motor 624 which is connected too the polishing belt driving means 623. The contact roller 622, the support rollers 625 and the polishing belt driving means 623 are contained inside a housing 628. A tape made of woven or non-woven cloth of synthetic fibers or a foamed material may be used for the polishing belt 621. As the driver motor 624 is operated, the polishing belt 621 is moved by the polishing belt driving means 623 through the contact roller 622 and the support rollers 625 and the target surface of the tape-shaped substrate 110 is polished. At the time of the polishing, it is preferable to supply aforementioned slurry onto the polishing belt 621. A motor 626 for oscillating the contact roller 622 perpendicularly to the direction of running motion of the tape-shaped substrate 110 may additionally be provided. This oscillatory motion serves to prevent the tape-shaped metallic substrate 110 from being polished by a same part of the polishing belt 621.

These polishing heads 610 and 620 are characterized in that the polishing surface of the cylindrical drum 601 or the polishing belt 621 rotates in or against the direction of motion of the tape-shaped substrate 110. The polishing head 610 or 620 comprises a polishing station together with the compressing mechanism 440 explained with reference to FIG. 3. A plurality of polishing stations may be connected in series for the second polishing process. In such an arrangement, it is preferable to provide a washing machine described above on the downstream side of each polishing station.

The tape-shaped metallic substrate 110 is subjected for the second polishing process at the aforementioned second polishing processing part 104. In the case of the polishing system shown in FIG. 1, the second polishing process is carried out by a random polishing method in two stages. At the time of the polishing, it is preferable to use slurry comprising abrading particles, water and a mixture of an additive (such as a lubricant and a dispersant for the abrading particles) with water. $SiO_2$, $Al_2O_3$, diamond, cBN, SiC and colloidal silica may be used as the abrading particles although they are not limited by these examples. The average diameter of the abrading particles to be used is 0.02-0.1 µm, and preferably 0.02-0.07 µm.

Appropriate polishing programs can be incorporated in the polishing system described above by combining the devices according to the given polishing conditions. When each polishing process is carried out in a plurality of stages, for example, the polishing conditions (such as the rotational speed of the polishing head and the diameters of the abrading particles in the slurry) may be appropriately adjusted.

As explained above, the first polishing process according to the polishing method of this invention comprises the step of polishing the target surface of the tape-shaped substrate such that its average surface roughness Ra will become 10 nm or less, and preferably 5 nm or less.

As explained above, furthermore, the second polishing process according to the polishing method of this invention comprises the step of polishing the target surface of the tape-shaped substrate such that its average surface roughness Ra will become 5 nm or less, preferably 2 nm or less, and more preferably 1 nm or less.

Preferably, the first polishing process is carried out as a normal random polishing process and the final finishing of the second polishing process is carried out such that polishing marks along the running direction of the tape-shaped substrate will be formed on the target surface that is polished.

The intermediate layer is formed on the surface of the tape-shaped substrate thus obtained. The IBAD (Ion Beam Assisted Deposition) method or the ISD (Inclined Substrate Deposition) method may be used to vapor-deposit a zirconia (YSZ) film stabilized by MgO, $CeO_2$, $SrTiO_2$ and $Y_2O_3$ as an intermediate layer having in-plane biaxial directionality. An oxide superconductor film is vapor-deposited on the intermediate layer. Thus, the tape-shaped substrate and the intermediate layer become the substrate for an oxide superconductor film. The present invention makes it possible to form an intermediate layer which is superior in crystal directionality and as a result to form a superconductor thin film with a high critical current.

EXAMPLES

Tape-shaped substrates were polished under various polishing conditions according to this invention and the directionality of the intermediate layers vapor-deposited thereon was examined. The results of these experiments will be described next.

A polishing device according to the continuous polishing system shown in FIG. 1 was used for the purpose. The polishing processes were carried out according to a polishing program either in a single stage or several stages. In the case of a polishing process in several stages, the abrading particles in the slurry were appropriately varied from fine to rough kinds and changes were appropriately made between random polishing and polishing in the running direction (in the direction of electric current).

Figure 6:
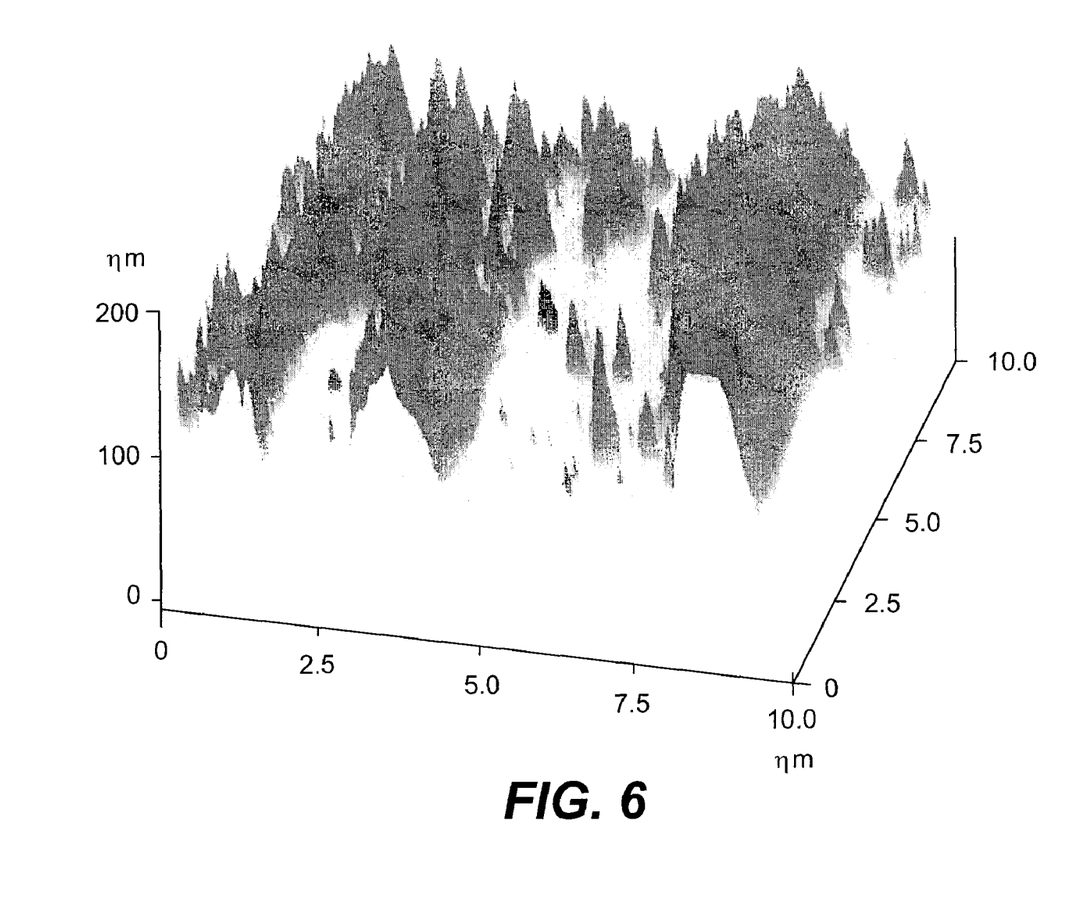
FIG. 6 is a computer-created image (by AFM) of the surface of a tape-shaped substrate before polishing.

Tape-shaped metallic substrates of Hastelloy C-276 (for example, 58% Ni-17% Mo-15% Cr-5% Fe-4% W) were used. These substrates were fabricated by a rolling technology such that the thickness of 0.1 mm, width of 10 mm and length of several hundred meters were obtained. FIG. 6 is a computer image (by AFM) of the surface of a tape-shaped substrate before polishing. The average surface roughness Ra of the substrates before the polishing was 15-30 nm. The maximum surface roughness $R_{max}$ was 200-500 nm, and the speed protrusions are traces of rolling generated by the rolling process.

A MgO (in-plane biaxial directional) film was formed as an oriented (directional) intermediate layer by using an IBAD (Ion Beam Assisted Deposition) device. It is to be noted here that an intermediate layer with thickness of 1 μm or greater used to be conventionally used because the value of Δφ generally tends to become smaller if the intermediate layer is thicker. In the present application, tests were conducted by intentionally keeping the thickness of the intermediate layer less than 1 μm (or specifically about 0.5 μm).

An assist beam was projected at an angle of 55° from the normal line to the substrate surface. The conditions for the forming of the film included the substrate temperature of 500°-600°, and the pressure in the oxygen atmosphere was several hundred mTorr (×0.133 Pa).

The in-plane directionality Δφ and the perpendicular directionality Δω were measured by evaluating the full width at half-maximum (FWHM) obtained by measuring the X-ray polar diagram.

Comparison Example 1

According to a polishing program, only a random polishing was carried out in one stage as the first polishing process (only 103a of FIG. 1). Slurry with polycrystalline diamond with average particle diameter D50 of 1 μm was used. A 30-weight % aqueous solution of glycol compounds, glycerol and fatty acid was used as the additive and it was adjusted to pH8. The polishing head was rotated while a tape of foamed polyurethane was supplied and the polishing process was carried out under the following conditions while a tape-shaped substrate was passed between a compression pad and slurry was being supplied.

| | |
|---|---|
| Rotational speed of the polishing head: | 60 rpm |
| Compressive force: | 300 g/cm² |
| Flow rate of slurry: | 10 ml/min |
| Running speed of the tape-shaped substrate | 20 m/hr |

Comparison Example 2

According to a polishing program, two identical polishing machines were connected in series (as 103a and 103b of FIG. 1) for only the first polishing process (103 of FIG. 1), carrying out random polishing in two stages under the same conditions as in Comparison Example 1.

Test Example 1

According to a polishing program, the first polishing process (103 of FIG. 1) was carried out by rotating the polishing head while feeding a foamed polyurethane tape thereto, passing a tape-shaped substrate between the compression pad and supplying slurry to carry out a random polishing process in two stages (103a and 103b of FIG. 1) under the following polishing conditions. The slurry for the first stage contained polycrystalline diamond particles with average diameter D50 of 1 μm and that for the second stage contained polycrystalline diamond particles with average diameter D50 of 0.5 μm. The additive was a 30-weight % aqueous solution of glycol compound, glycerol and fatty acid, adjusted to pH8.

| | |
|---|---|
| Rotational speed of the polishing head: | 60 rpm |
| Compressive force: | 300 g/cm² |
| Flow rate of slurry: | 10 ml/min |
| Running speed of the tape-shaped substrate | 20 m/hr |

The second polishing process (104 of FIG. 1) was carried out by rotating the polishing head while feeding a tape of non-woven cloth comprising polyester fibers, passing the tape-shaped substrate between the compression pad and supplying slurry with a random polishing device of the same form as for the first polishing process under the following polishing conditions. Slurry of colloidal silica with average particle diameter D50 of 0.03 μm was used. The additive was an aqueous solution with ammonium oxalate, potassium oxalate and glycerol added to DEMOL EP (trade name) of Kao Chemical Company, adjusted to pH9.

| | |
|---|---|
| Rotational speed of the polishing head: | 60 rpm |
| Compressive force: | 200 g/cm² |
| Flow rate of slurry: | 10 ml/min |
| Running speed of the tape-shaped substrate | 20 m/hr |

Test Example 2

According to a polishing program, the first polishing process (103 of FIG. 1) was carried out with the same polishing conditions as in Test Example 1 and the second polishing process (104 of FIG. 1) was carried out by connecting two polishing machines as used in Test Example 1 (104a and 104b of FIG. 1) to carry out random polishing in two stages under the same conditions as in Test Example 1. All the other polishing conditions were the same as in Test Example 1.

Test Example 3

According to a polishing program, the first polishing process (103 of FIG. 1) was carried out with the same polishing conditions as in Test Example 1 and the second polishing process (104 of FIG. 1) was by carrying out two-stage polishing in the running direction by connecting two polishing machines of the same type in series (104a and 104b of FIG. 1). Polycrystalline diamond with average diameter D50 of 1 μm was used as slurry. All the other polishing conditions were the same as in Test Example 1.

Evaluation

Results of the experiments were evaluated regarding the average surface roughness Ra of the target surface after the tape-shaped substrate was polished and the root mean square (RMS, or the square root of the averaged valued of the squares of the deviations between the average line and the measured curve) as well as the in-plane directionality and the perpendicular directionality of the intermediate layer after the intermediate layer film was formed on the polished surface. The average surface roughness Ra and the RMS of the surface of the tape-shaped substrate after the polishing process were measured by using a scanning probe microscope (Nanoscope Dimension 3100 Series, produced by Digital Instruments Inc.)

Figure 7:
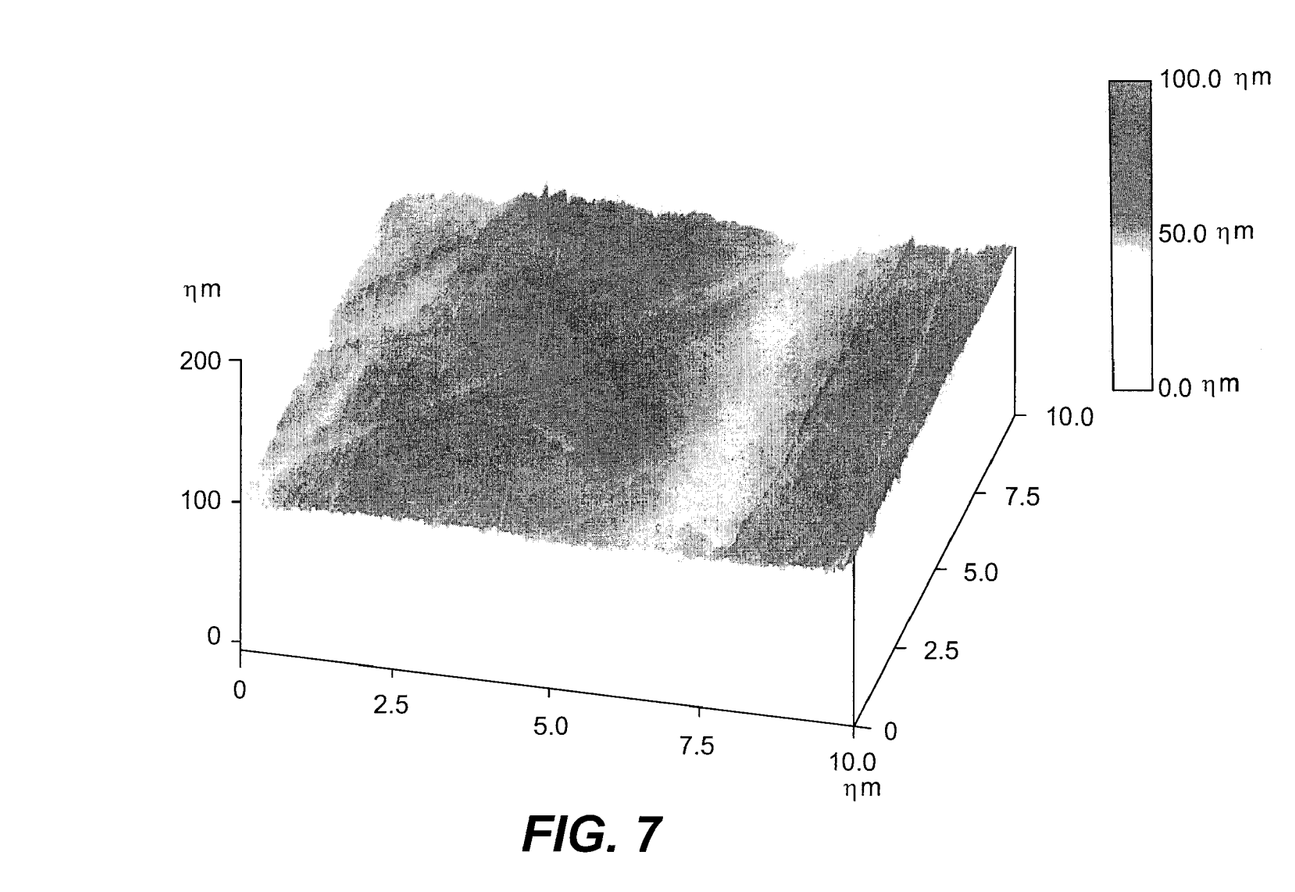
FIG. 7 is a computer-created image (by AFM) of the surface of Comparison Example 1 after polishing.
Figure 8:
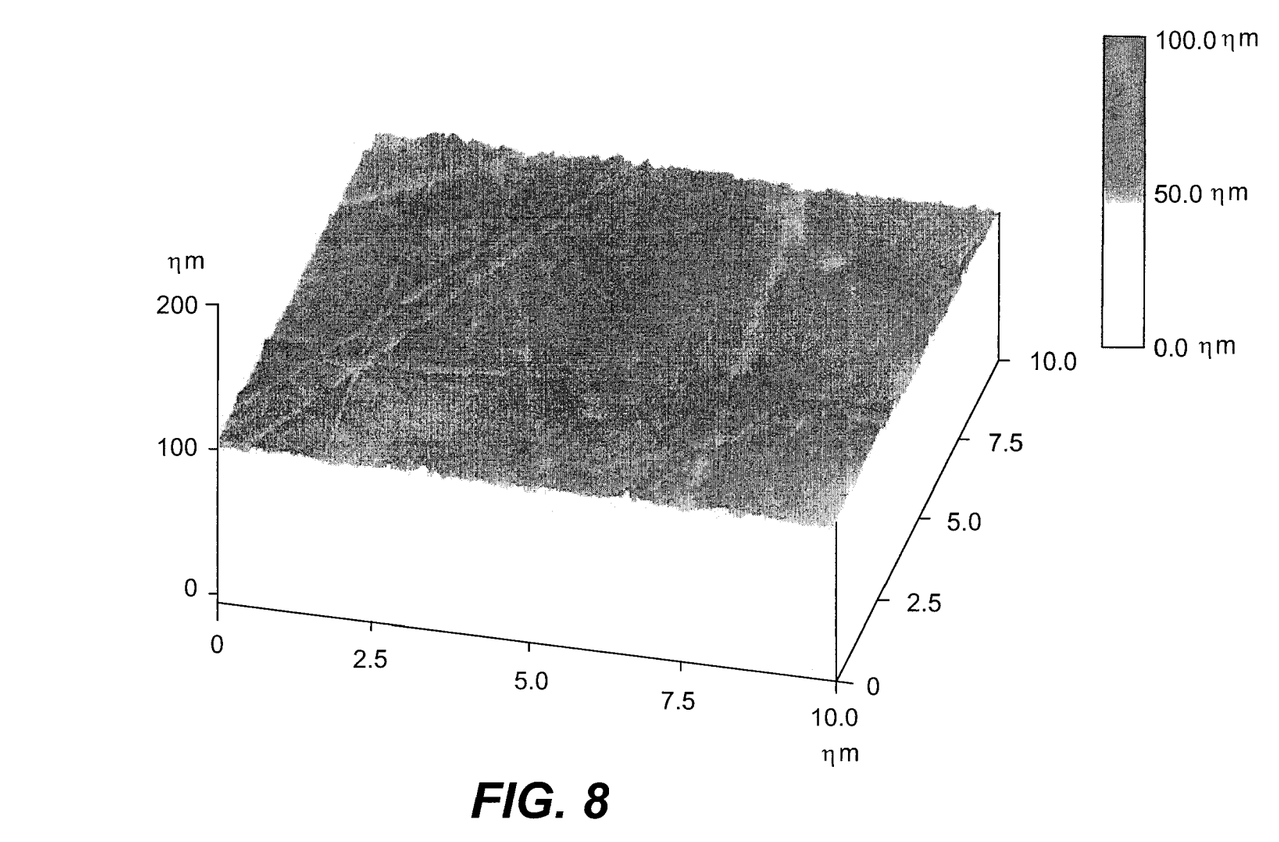
FIG. 8 is a computer-created image (by AFM) of the surface of Comparison Example 2 after polishing.
Figure 9:
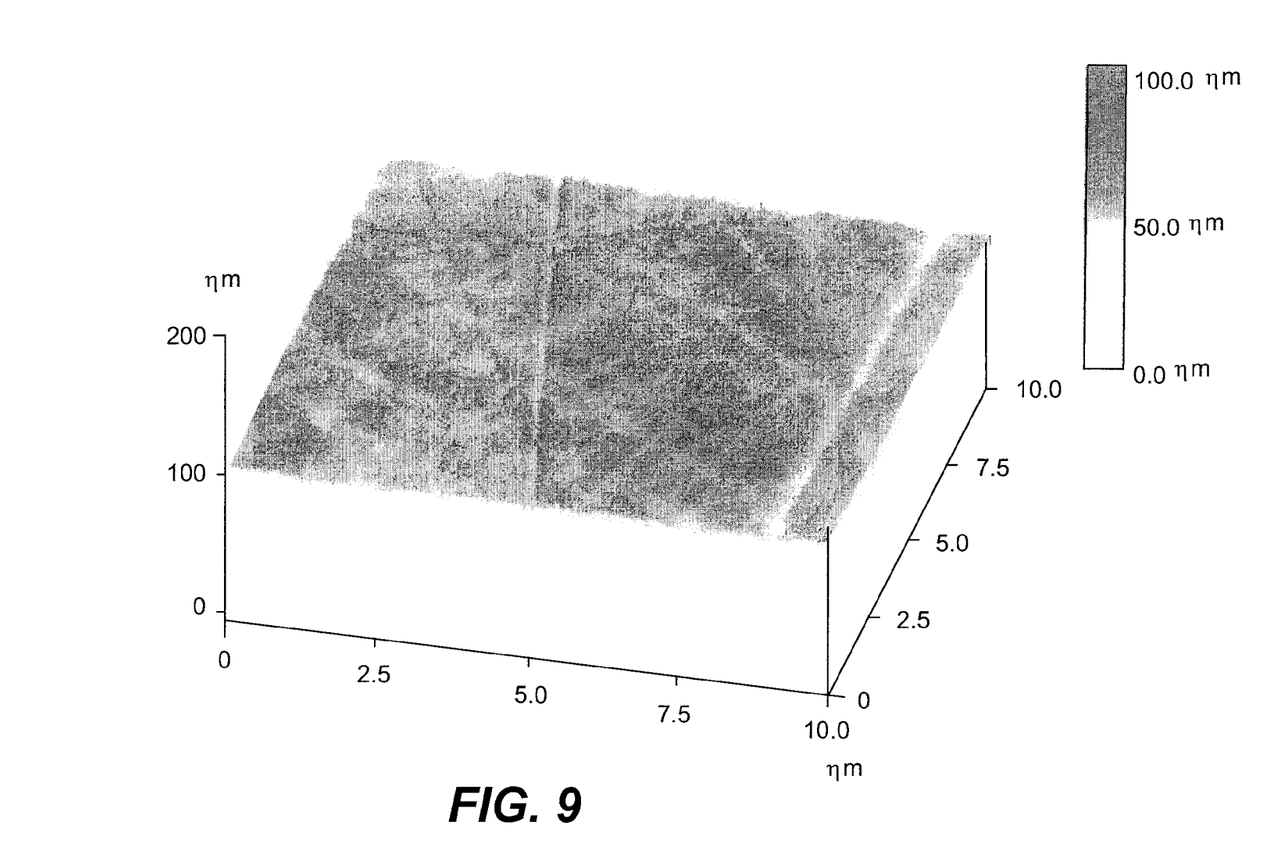
FIG. 9 is a computer-created image (by AFM) of the surface of Test Example 1 after polishing.
Figure 10:
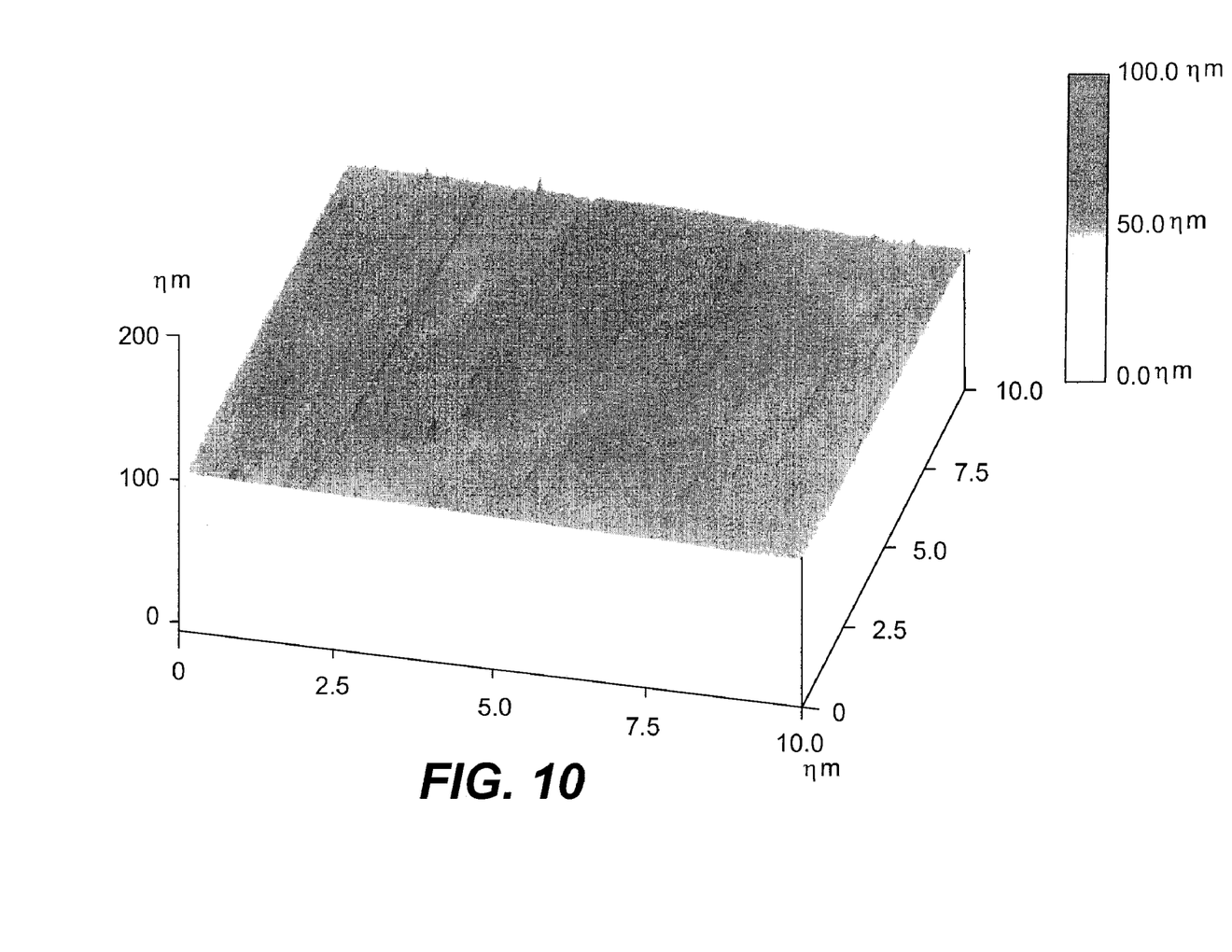
FIG. 10 is a computer-created image (by AFM) of the surface of Test Example 2 after polishing.
Figure 11:
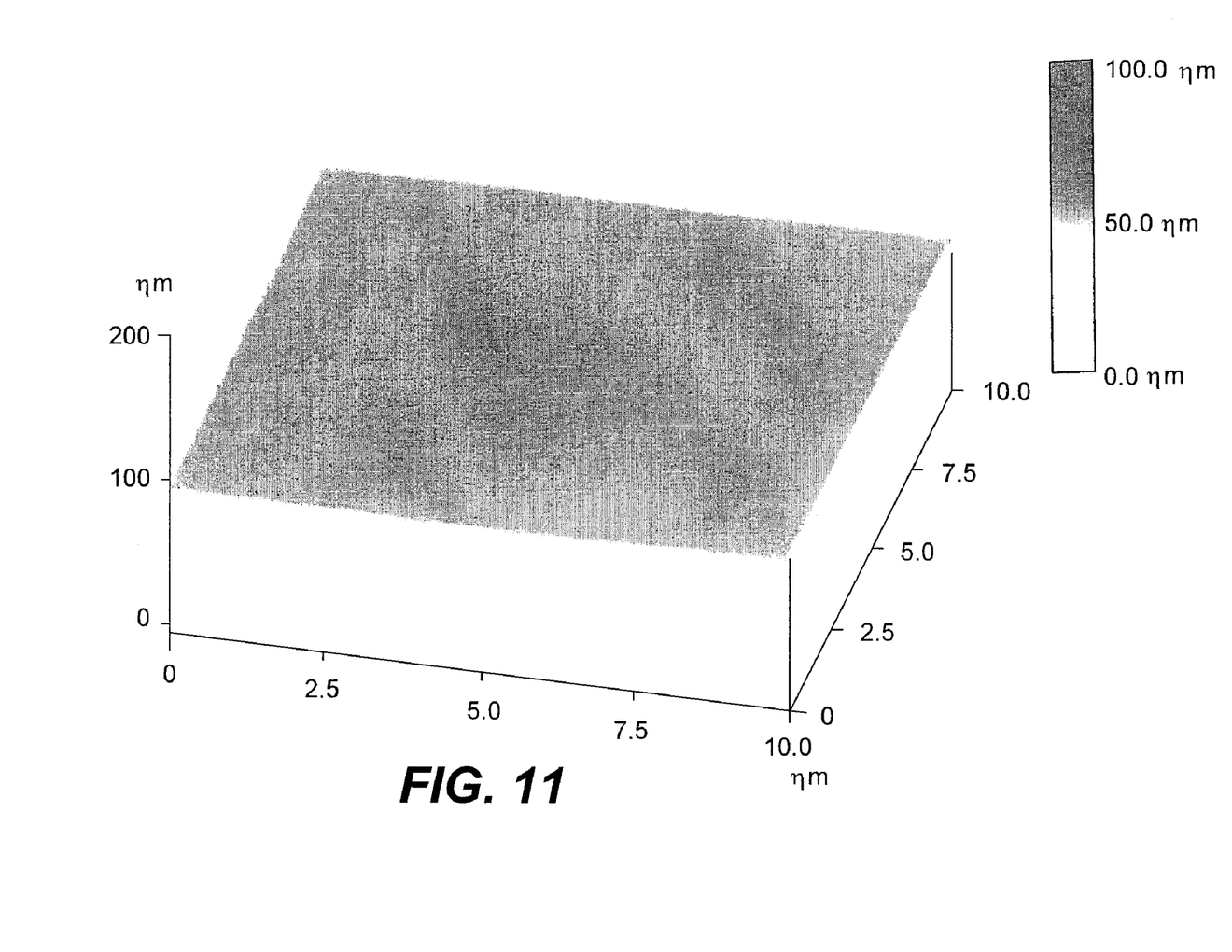
FIG. 11 is a computer-created image (by AFM) of the surface of Test Example 3 after polishing.

FIGS. 6-11 are (AFM) photographs of three-dimensional images created by a computer by scanning arbitrarily selected surface areas of 10 μm×10 μm of various tape-shaped substrates. FIG. 6 shows the surface of a tape-shaped substrate before the polishing. FIGS. 7 and 8 show the surface conditions of the tape-shaped substrate respectively of Comparison Examples 1 and 2 after the polishing process. FIGS. 9, 10 and 11 show the surface conditions of the tape-shaped substrate respectively of Test Examples 1, 2 and 3 after the polishing process.

Table 1 shows the results of the comparison experiments.

As shown in Table 1, if the target surface of the tape-shaped substrate is polished such that its surface roughness Ra becomes 2 nm or less (preferably 1 nm or less) and its RMS is 2.0 nm or less (preferably 1.5 nm or less), the in-plane directionality Δϕ of the intermediate layer film (MgO) becomes 5° or less and its perpendicular directionality Δω becomes 1.5° or less and hence that superior directionality characteristics can be achieved.

If Test Example 2 with only random polishing and Test Example 3 which is a combination of both random polishing and polishing in the running direction, it can be understood that Test Example 3 gives a high value for Ra than Test Example 2 but that Test Example 3 gives a lower value for Δϕ, making it possible to realize an extremely high level of flatness less than 4°. This indicates that the value of Δϕ depends on the direction of polishing more than Ra and can be improved particularly by polishing in the running direction.

It has also been made clear that in-plane directionality Δϕ of less than 4° can be realized with the thickness of intermediate layer less than 1 μm (0.5 μm according to the Test Examples) if a polishing method of this invention is used. Thus, this invention makes it possible to form the whole of a superconductor thin film thinner and applications in a wide range may be expected.

Although the invention has been shown above with reference to only some specific examples, they are merely intended to be demonstrative and not to limit its scope. For example, the number of stages in the random polishing device, the material of the polishing tape or the polishing pad, the rotational speed of the polishing head, the magnitude of the compressive force, the kind, the particle size and the flow rate of the slurry to be used, and the running speed of the tape-shaped substrate may be appropriately varied. Such variations are all intended to be in the spirit of and hence to be included within the scope of the invention.

TABLE 1

| | Average surface roughness Ra (nm) | RMS (nm) | Thickness of intermediate layer (μm) | In-plane directionality Δϕ (°) | Perpendicular directionality Δω (°) |
|---|---|---|---|---|---|
| Comparison Example 1 | 3.5 | 4.9 | 0.5 | 7.4 | 2.8 |
| Comparison Example 2 | 1.8 | 2.4 | 0.5 | 7.9 | 3.3 |
| Test Example 1 | 0.9 | 1.3 | 0.5 | 4.9 | 1.5 |
| Test Example 2 | 0.2 | 0.3 | 0.5 | 4.5 | 1.2 |
| Test Example 3 | 0.5 | 0.6 | 0.5 | 3.7 | 1.3 |

What is claimed is:

1. A method of polishing a target surface of a tape-shaped substrate, wherein said tape-shaped substrate, an intermediate layer that is formed on said tape-shaped substrate and an oxide superconductor thin film layer that is formed on said intermediate layer form an oxide superconductor member, said method comprising a polishing step of polishing said target surface while continuously running said tape-shaped substrate in a specified direction, said polishing step including an initial polishing process of carrying out random rotary polishing of said target surface of said tape-shaped substrate in at least one stage and thereby removing surface scratches formed by a rolling process and crystalline defects of said tape-shaped substrate and a finishing process of polishing said target surface of said tape-shaped substrate in said specified direction in at least one stage and thereby finishing said target surface into a smooth and flat surface, wherein the average surface roughness Ra of said target surface becomes 2 nanometer or less and the in-plane directionality Δϕ of said intermediate layer becomes 5° or less after said polishing step.

2. The method of claim 1 wherein polishing marks are formed in said running direction on said target surface by the second polishing process.

3. The method of claim 1 wherein said tape-shaped substrate is fabricated by rolling a material selected from the group consisting of nickel, nickel alloys and stainless steel.

4. The method of claim 1 wherein said polishing step is carried out by employing a pad or a tape of a foamed material comprising synthetic resin and fibers and while slurry is being supplied.

5. The method of claim 4 wherein said slurry comprises abrading particles, water and a mixture of an additive with water, wherein said abrading particles are of at least one material selected from the group consisting of monocrystalline diamond, polycrystalline diamond, fumed silica, colloidal silica, alumina, cBN and SiC.

6. The method of claim 5 wherein the average diameter of said abrading particles is 0.1 μm-3 μm for said first polishing process and 0.02 μm-0.5 μm for said second polishing process.

7. The method of claim 5 wherein said abrading particles used in said second polishing process are diamond particles used for polishing longitudinally along said substrate.

8. The method of claim 1 wherein said intermediate layer is 1 μm or less in thickness.

9. An oxide superconductor member produced by the method of claim 1, said oxide superconductor member comprising:

a tape-shaped substrate having a target surface with average surface roughness Ra of 2 nanometers or less;

an intermediate layer formed on said target surface of said tape-shaped substrate, the in-plane directionality $\Delta\phi$ of said intermediate layer being 5° or less; and an oxide superconductor thin film layer formed on said intermediate layer;

wherein said target surface of said tape-shaped substrate has been polished by a method comprising a polishing step of polishing said target surface while running said tape-shaped substrate, said method including an initial polishing process and a finishing process such that the average surface roughness Ra of said target surface becomes 2 nanometer or less and the in-plane directionality $\Delta\phi$ of said intermediate layer becomes 5° or less after said polishing step.

10. The oxide superconductor member of claim 9 wherein said tape-shaped substrate is fabricated by rolling a material selected from the group consisting of nickel, nickel alloys and stainless steel.

11. The oxide superconductor member of claim 9 wherein said intermediate layer is 1 μm or less in thickness.

12. A base material for an oxide superconductor member comprising:

a tape-shaped substrate produced by the method of claim 1, said tape-shaped substrate having a target surface with average surface roughness Ra of 2 nanometers or less; and an intermediate layer formed on said target surface of said tape-shaped substrate, the in-plane directionality $\Delta\phi$ of said intermediate layer being 5° or less;

wherein said target surface of said tape-shaped substrate has been polished by a method comprising a polishing step of polishing said target surface while running said tape-shaped substrate, said method including an initial polishing process and a finishing process such that the average surface roughness Ra of said target surface becomes 2 nanometer or less and the in-plane directionality $\Delta\phi$ of said intermediate layer becomes 5° or less after said polishing step.

13. The base material of claim 12 wherein said tape-shaped substrate is fabricated by rolling a material selected from the group consisting of nickel, nickel alloys and stainless steel.

14. The base material of claim 12 wherein said intermediate layer is 1 μm or less in thickness.

\* \* \* \* \*